(12) United States Patent
Kang et al.

(10) Patent No.: US 7,485,558 B2
(45) Date of Patent: Feb. 3, 2009

(54) METHOD OF MANUFACTURING SEMICONDUCTOR DEVICE

(75) Inventors: Sung-Gun Kang, Suwon-si (KR);
 Kong-Soo Cheong, Seoul (KR);
 Jeong-Ho Shin, Gyeonggi-do (KR);
 Ki-Young Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 11/041,555

(22) Filed: Jan. 24, 2005

(65) Prior Publication Data

US 2005/0164437 A1 Jul. 28, 2005

(30) Foreign Application Priority Data

Jan. 27, 2004 (KR) .................. 10-2004-0004950

(51) Int. Cl.
| | |
|---|---|
| H01L 21/3205 | (2006.01) |
| H01L 21/4763 | (2006.01) |
| H01L 21/44 | (2006.01) |
| H01L 21/302 | (2006.01) |
| H01L 21/461 | (2006.01) |

(52) U.S. Cl. .................. 438/592; 438/664; 438/755; 438/655

(58) Field of Classification Search .................. 438/197, 438/475, 592, 630, 633, 680, 649, 651, 653, 438/655, 660, 664, 663; 257/296, 303, 304, 257/306
See application file for complete search history.

(56) References Cited

U.S. PATENT DOCUMENTS

| | | | | |
|---|---|---|---|---|
| 5,003,375 | A | * | 3/1991 | Ichikawa .................... 257/755 |
| 5,792,684 | A | * | 8/1998 | Lee et al. .................... 438/238 |
| 6,097,077 | A | * | 8/2000 | Gordon et al. ............... 257/530 |
| 6,194,256 | B1 | | 2/2001 | Lee et al. .................... 438/197 |
| 6,329,276 | B1 | | 12/2001 | Ku et al. ..................... 438/586 |
| 6,372,569 | B1 | | 4/2002 | Lee et al. .................... 438/229 |
| 6,573,172 | B1 | | 6/2003 | En et al. ..................... 438/626 |
| 7,041,543 | B1 | * | 5/2006 | Varadarajan et al. ........ 438/197 |
| 2003/0040158 | A1 | * | 2/2003 | Saitoh ........................ 438/279 |
| 2005/0170104 | A1 | * | 8/2005 | Jung et al. .................. 427/569 |

FOREIGN PATENT DOCUMENTS

| | | |
|---|---|---|
| JP | 00-36605 | 2/2000 |
| KR | 98-0138959 | 2/1998 |
| KR | 10-0271948 | 8/2000 |

* cited by examiner

*Primary Examiner*—Chuong A. Luu
(74) *Attorney, Agent, or Firm*—Mills & Onello LLP

(57) ABSTRACT

In a method of manufacturing a semiconductor device, a preliminary metal silicide layer is selectively formed on a substrate having a transistor, the transistor having source/drain regions. A capping layer having a thermal expansion coefficient greater than that of the preliminary metal silicide layer is formed on the substrate having the preliminary metal silicide layer. The substrate is thermally treated to form a metal silicide layer, and to apply a tensile stress caused by a thermal expansion coefficient difference between the metal silicide layer and the capping layer to the source/drain regions of the transistor.

10 Claims, 12 Drawing Sheets

METHOD OF MANUFACTURING SEMICONDUCTOR DEVICE

CROSS REFERENCE TO RELATED APPLICATION

This application claims priority under 35 USC § 119 to Korean Patent Application No. 2004-4950, filed on Jan. 27, 2004, the contents of which are herein incorporated by reference in their entirety.

BACKGROUND OF THE INVENTION

1. Field of the Invention

The present invention relates to a method of manufacturing a semiconductor device including a transistor. More particularly, the present invention relates to a method of manufacturing a semiconductor device that includes an improved transistor of which carriers rapidly move in a channel region under a gate electrode thereof.

2. Description of the Related Arts

In recent years, as information media such as a computers enjoy widespread use, semiconductor devices continue to develop at a rapid pace. in general, semiconductor devices with rapid operation speeds and a large amount of memory are desired. To meet these requirements, semiconductor manufacturing technology must keep pace to continuously improve integration degree, reliability, response speed, etc., of semiconductor devices.

To improve the response speed of the semiconductor device, a material for reducing parasitic capacitance is employed in wiring of the semiconductor device. In addition, a reduction in sheet resistance and contact resistance between a gate electrode and source/drain regions can have beneficial effects. To reduce the sheet resistance and the contact resistance, a metal silicide layer having a lower specific resistance is selectively formed on surfaces of the gate electrode and the source/drain regions corresponding to an interface between a polysilicon layer and a substrate. Here, examples of the metal silicide layer include a titanium silicide layer, cobalt silicide layer, tungsten silicide layer, etc. Particularly, the technology for forming the metal silicide layer is used for improving characteristics of a gate electrode of a dynamic random access memory (DRAM) having a storage capacity of no less than about one gigabite, and other devices, including logic devices, merged memory logic (MML), and the like.

FIGS. 1A to 1C are cross sectional views illustrating a conventional method of forming a CMOS transistor including a metal silicide layer.

Referring to FIG. 1A, a semiconductor substrate 10 having an N type metal oxide semiconductor (MOS) transistor and a P type MOS transistor is provided. An isolation layer 12 partitions the semiconductor substrate 10 into an N type MOS transistor formation region and a P type MOS transistor formation region.

The P type MOS transistor 20a includes a gate electrode 14a, source/drain regions 18a having lightly doped drain (LDD) structures in which P type impurities are doped, a spacer 16 formed on a sidewall of the gate electrode 14a, and a channel region (not shown). The N type MOS transistor 20b includes a gate electrode 14b, source/drain regions 18b having a lightly doped drain (LDD) structure in which N type impurities are doped, the spacer 16 formed on a sidewall of the gate electrode 14b, and a channel region (not shown).

Referring to FIG. 1B, a metal layer 22 is formed on the P type MOS transistor, the N type MOS transistor and the semiconductor substrate 10. The metal layer 10 is thermally treated at a temperature of about 450° C. to form a preliminary metal silicide layer (not shown). Any remaining metal layer that does not react with an underlying metal material is then removed.

Referring to FIG. 1C, the preliminary metal silicide layer is additionally thermally treated at a temperature of about 850° C. to form a metal silicide layer 24 having a low resistance, thereby completing the transistors 20a, 20b on the substrate 10.

The metal silicide layer 24 reduces sheet resistance and contact resistance of the gate electrodes 14a and 14b and the source/drain regions 18a and 18b, respectively, so that performance of the transistors may be improved.

However, as critical dimensions of the gate electrode and the source/drain regions continue to decrease due to the trend toward ever higher integration of semiconductor devices, forming crystalline germs of metal silicide that is formed by a chemical reaction between metal and silicon becomes increasingly difficult so that external resistance factors are increased. The external resistance factors cause a corresponding increase of resistance and cohesion of metal silicide in the gate electrode and the source/drain regions, thereby deteriorating the performance of the resulting N type MOS transistor 20a and the P type MOS transistor 20b. In particular, the performance of the P type MOS transistor may be even more adversely affected in comparison with the N type MOS transistor.

SUMMARY OF THE INVENTION

The present invention provides a method of manufacturing a semiconductor device, which is capable of improving characteristics of a P type MOS transistor.

In accordance with one aspect of the present invention, there is provided a method of manufacturing a semiconductor device. In the method of manufacturing the semiconductor device, a preliminary metal silicide layer is selectively formed on a substrate having a transistor, the transistor having source/drain regions. A capping layer having a thermal expansion coefficient greater than that of the preliminary metal silicide layer is formed on the substrate having the preliminary metal silicide layer. The substrate is thermally treated to form a metal silicide layer, and to apply a tensile stress caused by a thermal expansion coefficient difference between the metal silicide layer and the capping layer to the source/drain regions of the transistor.

In one embodiment, the transistor comprises a P type metal oxide semiconductor (MOS) transistor.

In another embodiment, forming the transistor comprises: providing the substrate having an isolation layer; forming a gate electrode on the substrate; implanting first impurities at a relatively low concentration into the substrate using the gate electrode as an ion implantation mask; forming a spacer on a sidewall of the gate electrode; and implanting second impurities at a relatively high concentration into the substrate using the gate electrode having the spacer as an ion implantation mask to form the source/drain regions having lightly doped drain (LDD) structures.

In another embodiment, the capping layer and the metal silicide layer are cooled to generate the tensile stress that reduces intervals between atoms in a channel region of the transistor to improve mobility of carriers in the channel region.

In another embodiment, forming the preliminary metal silicide layer comprises: forming a metal layer on the substrate having the transistor; thermally treating the metal layer at a temperature of not more than about 550° C. to form the preliminary metal silicide layer on the source/drain regions and a gate electrode of the transistor; and removing non-reactive portions of the metal layer.

In another embodiment, the metal layer comprises cobalt, the preliminary metal silicide layer comprises cobalt silicide, and the capping layer comprises titanium nitride.

In another embodiment, the capping layer is formed on the source/drain regions only.

In another embodiment, the substrate having the capping layer and the preliminary metal silicide layer is thermally treated at a temperature of about 750° C. to about 950° C.

In accordance with another aspect of the present invention there is provided a method of manufacturing a semiconductor device. In the method of manufacturing the semiconductor device, a substrate having a P type MOS transistor and an N type MOS transistor that have a gate electrode, source/drain regions and a spacer, respectively, is provided. A preliminary metal silicide layer is selectively formed on the substrate having the P type MOS transistor and the N type MOS transistor. Capping layer patterns having thermal expansion coefficients greater than that of the preliminary metal silicide layer is formed at portions of the preliminary metal silicide layer positioned on the source/drain regions of the P type MOS transistor. The substrate is thermally treated to change the preliminary metal silicide layer into a metal silicide layer. The thermally treated substrate is cooled to apply a tensile stress caused by a thermal expansion coefficient difference between the metal silicide layer and the capping layer to source/drain regions of the P type MOS transistor. The tensile stress reduces intervals between atoms in a channel region of the P type MOS transistor.

In one embodiment, the tensile stress that reduces intervals between atoms in a channel region of the P type MOS transistor is generated in cooling the substrate.

In another embodiment, the source/drain regions have lightly doped drain (LDD) structures.

In another embodiment, forming the preliminary metal silicide layer comprises: forming a metal layer on the substrate having the transistors; thermally treating the metal layer at a temperature of not more than about 550° C. to form the preliminary metal silicide layer on the source/drain regions and gate electrodes of the transistors; and removing non-reactive portions of the metal layer.

In another embodiment, the metal layer comprises cobalt, the preliminary metal silicide layer comprises cobalt silicide, and the capping layer patterns comprise titanium nitride.

In another embodiment, forming the capping layer patterns comprises: forming a capping layer on the substrate having the preliminary metal silicide layer; selectively forming a photoresist pattern on the source/drain regions of the P type MOS transistor; and selectively removing portions of the capping layer exposed through the photoresist pattern to form the capping layer patterns.

In another embodiment, the preliminary metal silicide layer is thermally treated at a temperature of about 750° C. to about 950° C.

According to the present invention, the tensile stress caused by the difference between the thermal expansion coefficients of the capping layer and the metal silicide layer is applied to the source/drain regions of the P type MOS transistor so that the mobility of carriers in the channel region of the P type MOS transistor is increased. In this manner, the performance of the P type MOS transistor is improved.

BRIEF DESCRIPTION OF THE DRAWINGS

The above objects and advantages of the present invention will become more apparent by describing preferred embodiments in detail with reference to the attached drawings in which.

DETAILED DESCRIPTION OF THE INVENTION

The present invention will be described more fully hereinafter with reference to the accompanying drawings, in which exemplary embodiments of the invention are shown.

FIGS. 2A to 2G are cross sectional views illustrating a method of manufacturing a semiconductor device in accordance with one embodiment of the present invention. In FIGS. 2A to 2G, a P type MOS transistor of a CMOS transistor is illustrated.

Figure 1A:
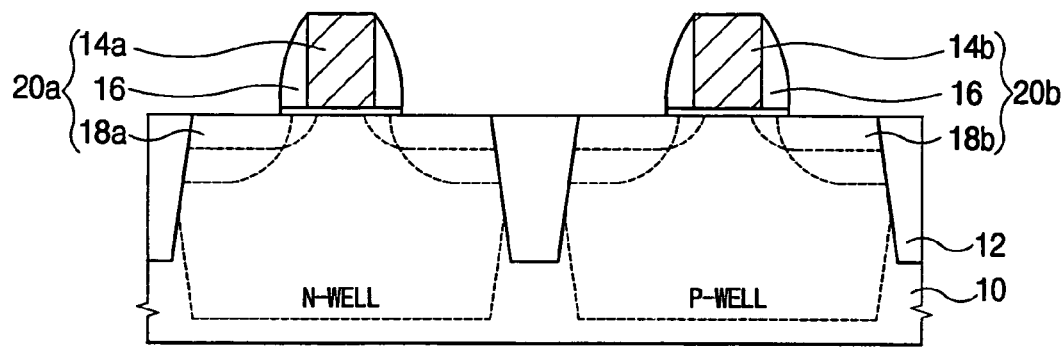
FIGS. 1A to 1C are cross sectional views illustrating a conventional method of manufacturing a CMOS transistor including a metal silicide layer.
Figure 1B:
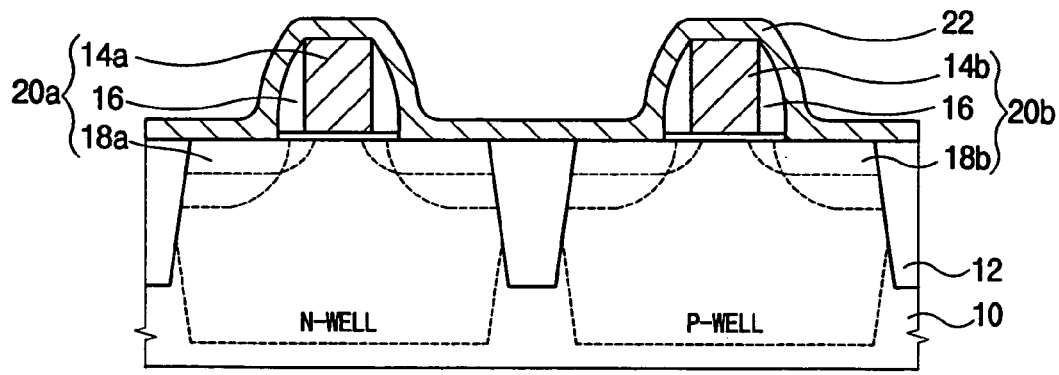
Figure 1C:
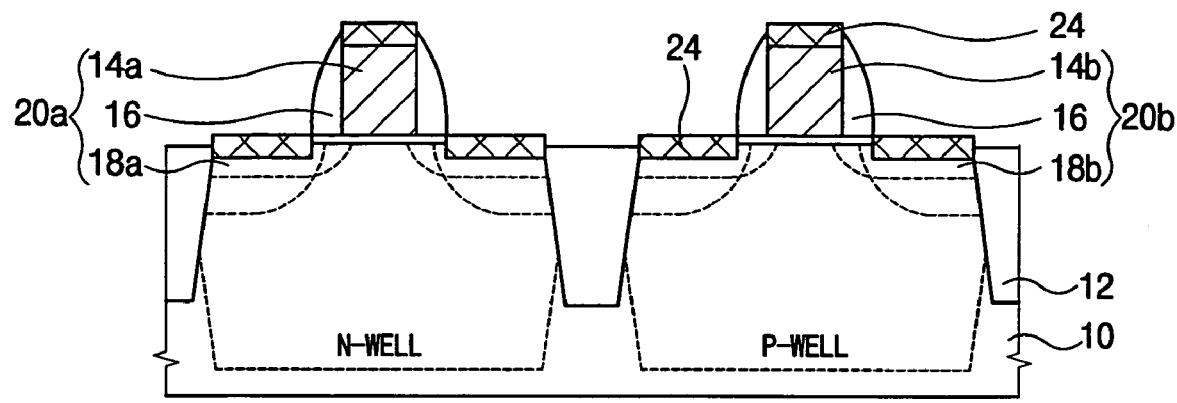
Figure 2A:
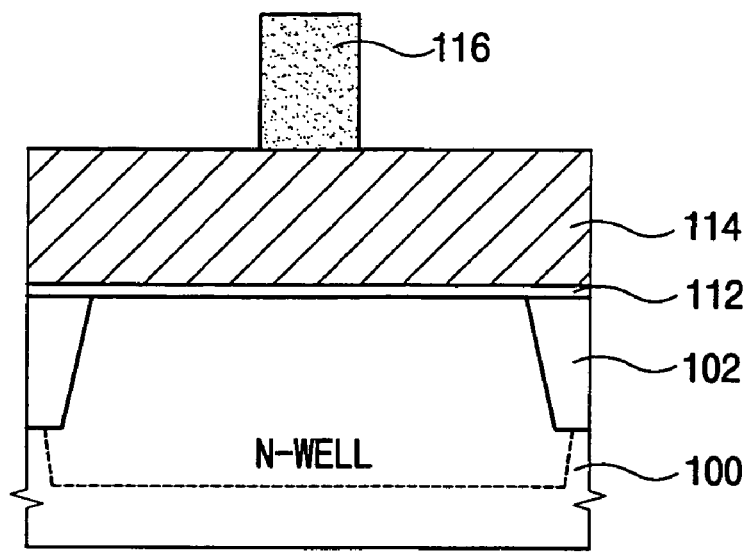
FIGS. 2A to 2G are cross sectional views illustrating a method of manufacturing a semiconductor device in accordance with one embodiment of the present invention.

Referring to FIG. 2A, an isolation layer 102 is formed on a semiconductor substrate 100 including silicon (Si) to partition the substrate 100 into an active region and a field region. The isolation layer 102 may be formed by a shallow trench isolation (STI) process. N type impurities at a low concentration are implanted into the substrate 100 to form an N type well in the active region of the substrate 100 defined by the isolation layer 102.

A silicon oxide or a silicon oxynitride film is formed on the substrate 100 so that a gate insulation layer 112 having a thickness of no more than about 60 Å is formed on the substrate 100. For example, the gate insulation layer 112 is formed by a thermal oxidation process.

A polysilcion layer 114 having a thickness of no more than about 2,500 Å is formed on the gate insulation layer 112 by a chemical vapor deposition (CVD) process.

In one embodiment of the present invention, to ensure a process margin of a successive photolithography process for forming a gate electrode 114a, an anti-reflective layer may be formed on the polysilicon layer 114. The anti-reflective layer prevents scattering of light from an underlying layer in the photolithography process, thereby forming a photoresist pattern having excellent resolution on the anti-reflective layer.

A photoresist film is formed on the polysilicon layer 114, for example by a spin coating process. Then, the photoresist film is exposed and developed to form a photoresist pattern 116 that defines the gate electrode 114a.

Figure 2B:
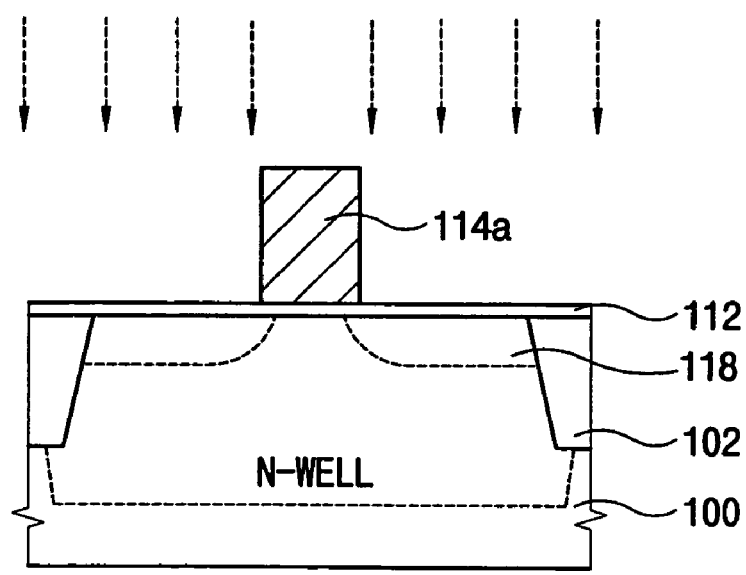

Referring to FIG. 2B, the polysilicon layer 114 is etched using the photoresist pattern 116 as an etching mask to form a polysilicon layer pattern on the gate insulation layer 112. The polysilicon layer pattern corresponds to the gate electrode 114a. The photoresist pattern 116 on the gate electrode 114a is then removed by an ashing process and/or a stripping process. When the gate electrode 114a is formed, a portion of the gate insulation layer 112 is exposed.

Using the gate electrode 114a as an ion implantation mask, P type impurities are implanted into a portion of the substrate 100 where the exposed portion of the gate insulation layer 112 as indicated using arrows. The P type impurities at a low concentration are implanted into the portion of the substrate 100 to form a first impurity region 118 having a first concentration. Examples of the P type impurities include an element in Group III such as boron (B), gallium (Ga), indium (In), etc.

Figure 2C:
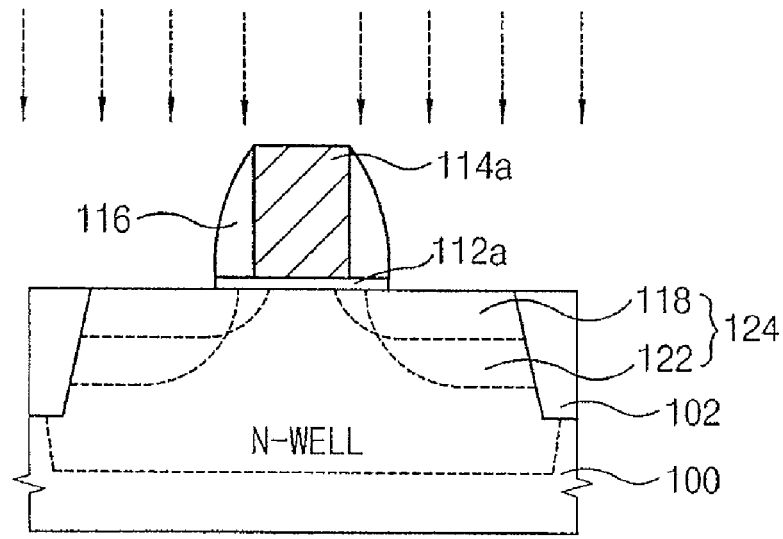

Referring to FIG. 2C, a nitride layer (not shown) having a thickness of no more than about 100 Å is formed on the gate insulation layer 112 to cover the gate electrode 114a. The nitride layer is then etched until the gate electrode 114a and the gate oxide layer 112 are exposed, thereby forming a gate spacer 116 on a sidewall of the gate electrode 114a.

Using the spacer 116 and the gate electrode 114a as ion implanting masks, N type impurities are implanted into the portion of the substrate 100 as indicated using arrows so that a second impurity region 122 having a second concentration is formed. The first and second impurity regions 118 and 122 are partially overlapped with each other to form source/drain regions 124 having lightly doped drain (LDD) structures. The gate insulation layer 112 is etched to form a gate insulation layer pattern 112a between the substrate 100 and the gate electrode 114a in the above-described processes. Thus, a gate structure including the gate electrode 112a, the spacer 116 and the source/drain regions 124 is formed on the substrate 100.

A channel region (not shown) is positioned at a portion of the substrate 100 under the gate electrode 114a between the source/drain regions 124. When a voltage is applied to the gate electrode 114a, the source/drain regions 124 are electrically connected to each other through the channel region.

Figure 2D:
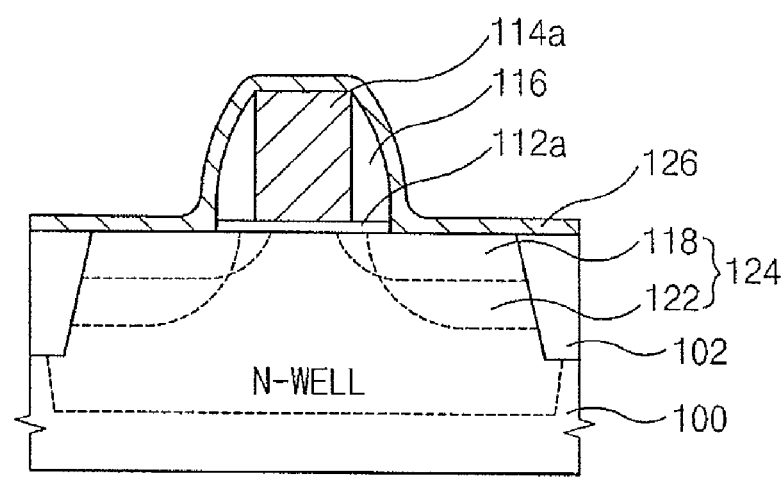

Referring to FIG. 2D, a metal layer 126 having a thickness of no more than about 500 Å is formed on the substrate 100 to cover the gate structure that includes the gate electrode 114a, the source/drain regions 124 and the spacer 116. in one example, the metal layer 126 includes cobalt (Co).

Figure 2E:
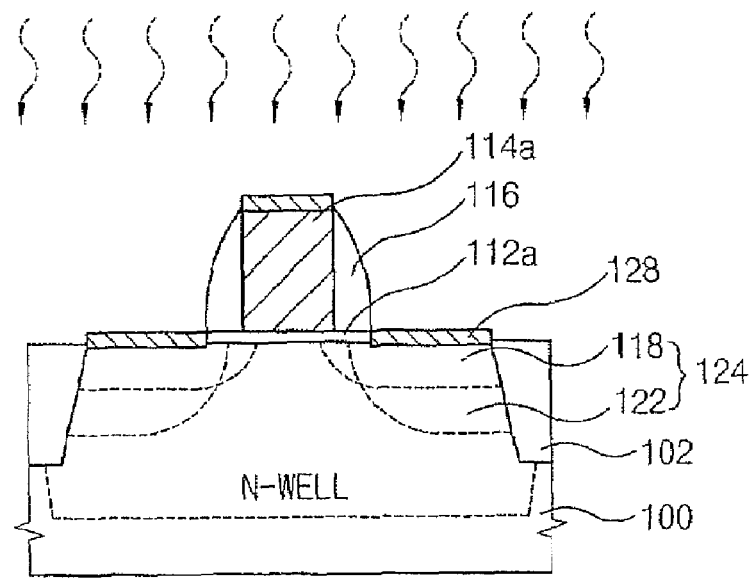

Referring to FIG. 2E, the substrate 100 including the gate structure and the metal layer 126 is primarily thermally treated at a temperature of no more than about 550° C. to form a preliminary cobalt silicide layer 128 on the gate electrode 114a and the source/drain regions 124. The preliminary cobalt silicide layer 128 is formed in accordance with chemical reaction between silicon included in the gate electrode 114a and the source/drain regions 124 and cobalt contained in the metal layer 126. Any remaining metal layer 126 is then removed from the substrate 100 and the spacer 116 by a wet etching process.

Figure 2F:
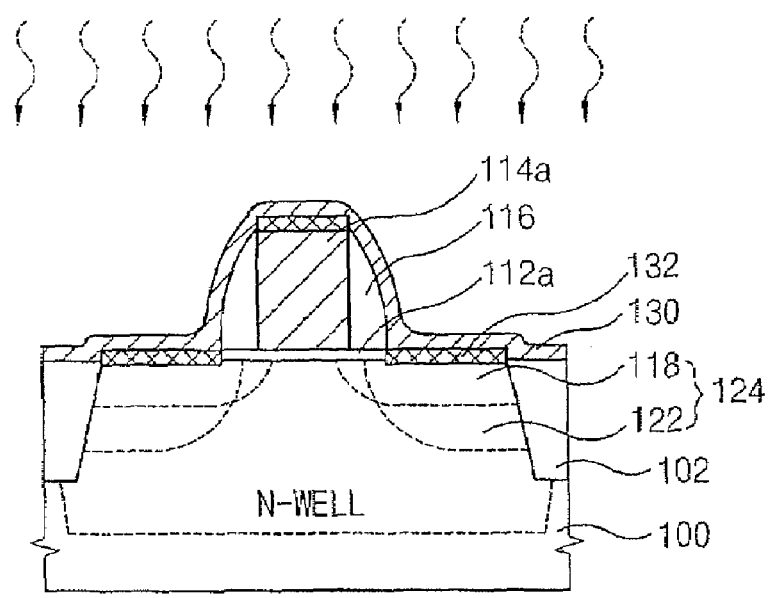

Referring to FIG. 2F, a capping layer 130 having a thickness of no more than about 500 Å is formed on the substrate 100 to cover the preliminary cobalt silicide layer 128 and the spacer 116. The capping layer 130 may be formed using a material that has a thermal expansion coefficient substantially greater than that of the preliminary cobalt silicide layer 128. For example, the capping layer 130 includes titanium nitride.

Figure 2G:
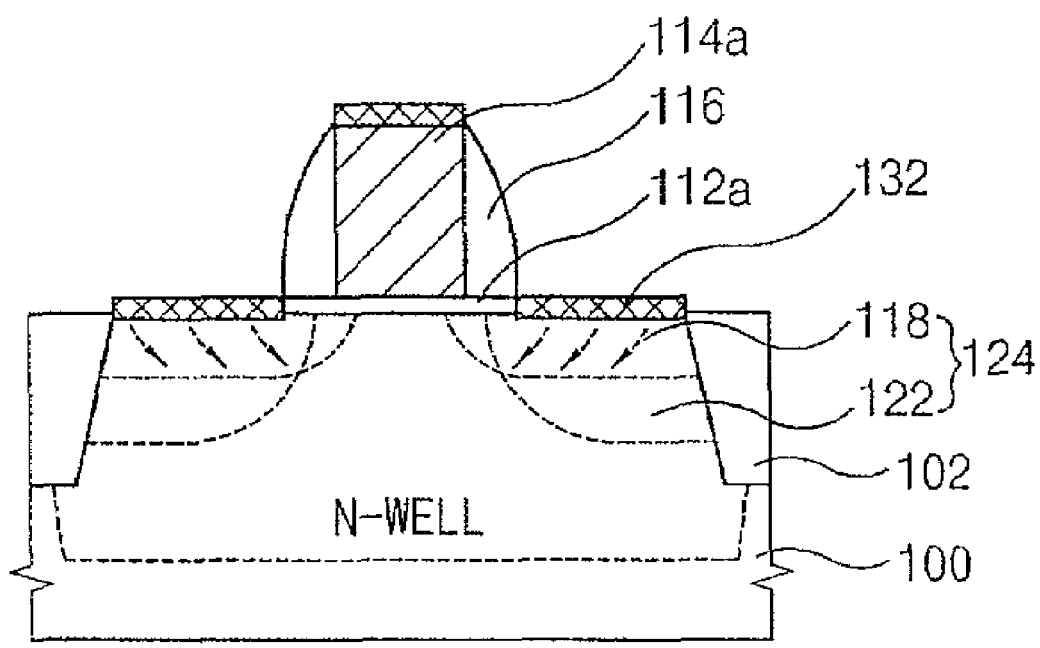

Referring to FIG. 2G, the substrate 100 including the gate structure, the preliminary cobalt silicide layer 128 and the capping layer 130 is secondarily thermally treated at a temperature of about 750° C. to about 950° C., thereby forming a cobalt silicide layer 132 on the gate electrode 114a and the source/drain regions 124. Here, the material included in the preliminary cobalt silicide layer 128 is phase-changed to cobalt silicide ($CoSi_2$) so that the cobalt silicide layer 132 is completed on the gate electrode 114a and the source/drain regions 124. The cobalt silicide layer 132 has a thermal expansion coefficient substantially different from that of the capping layer 130 of titanium nitride. Additionally, the cobalt silicide layer 132 and the capping layer 130 are also formed at the high temperature. Therefore, when the substrate 100 having the cobalt silicide layer 132 and the capping layer 130 formed thereon is cooled, a tensile stress that presses the source/drain regions 124 is generated due to a difference of the thermal expansion coefficients between cobalt silicide layer 132 and the capping layer 130. In particular, the tensile stress is generated in contracting the cobalt silicide layer 132 and the capping layer 130 after thermally expanding the cobalt silicide layer 132 and the capping layer 130. The tensile stress may reduce intervals between atoms positioned in the channel region to increase mobility of carriers in the channel region. Namely, the tensile stress is applied to the source/drain regions 124 to reduce the intervals between the atoms positioned in the channel region, thereby increasing the mobility of the carriers. As a result, the P type MOS transistor of the present embodiment of the invention has improved performance due to the increased mobility of the carriers.

The capping layer 130 is then removed to complete the P type MOS transistor of the present embodiment having the improved mobility of the carriers in the channel region.

FIGS. 3A to 3K are cross sectional views illustrating a method of manufacturing a semiconductor device in accordance with one embodiment of the present invention. In FIGS. 3A to 3K, a CMOS transistor including both an N type MOS transistor and a P type MOS transistor is depicted.

Figure 3A:
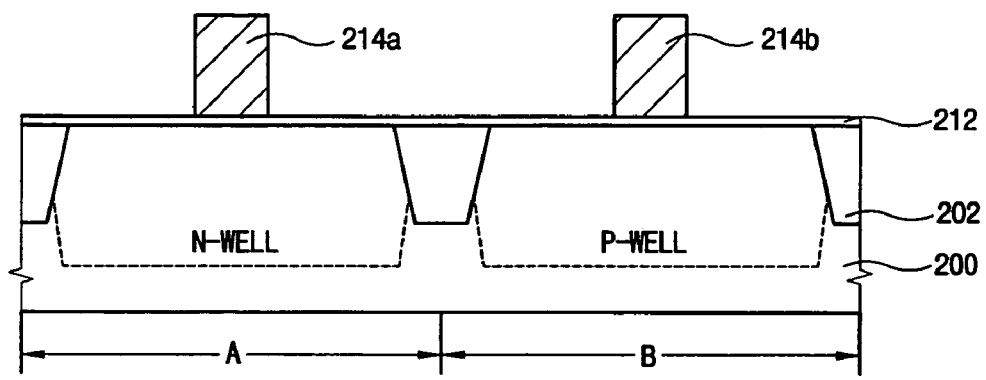
FIGS. 3A to 3K are cross sectional views illustrating a method of manufacturing a semiconductor device in accordance with another embodiment of the present invention.

Referring to FIG. 3A, a gate electrode 214a of the P type MOS transistor is formed in a first area A of a semiconductor substrate 200 where the P type MOS transistor is formed. In addition, a gate electrode 214b of the N type MOS transistor is formed in a second area B of the semiconductor substrate 200 where the N type MOS transistor is formed.

Particularly, an isolation layer 202 is formed on the semiconductor substrate 200 including silicon to partition the substrate 200 into the first area A and the second area B. For example, the isolation layer 202 is formed by a shallow trench isolation process.

N type impurities are implanted into the first area A of the substrate 200 P type with a relatively low concentration to form an N type well in the first area A of the substrate 200. Additionally, P type impurities are implanted into the second area B of the substrate 200 with a relatively low concentration to form a P type well in the second area B.

After a gate oxide layer 212 having a thickness of no more than about 60 Å is formed on the substrate 200, a polysilicon layer (not shown) having a thickness of no more than about 2,500 Å is formed on the gate oxide layer 112 by a chemical vapor deposition process.

After a photoresist pattern (not shown) is formed on the polysilicon layer, the polysilicon layer is etched using the photoresist pattern as an etching mask so that polysilicon layer patterns are formed on the first area A and the second area B, respectively. The polysilicon layer patterns correspond to the gate electrodes 214a and 214b. Then, the photoresist pattern is removed from the substrate 200 by an ashing process and/or a stripping process.

Figure 3B:
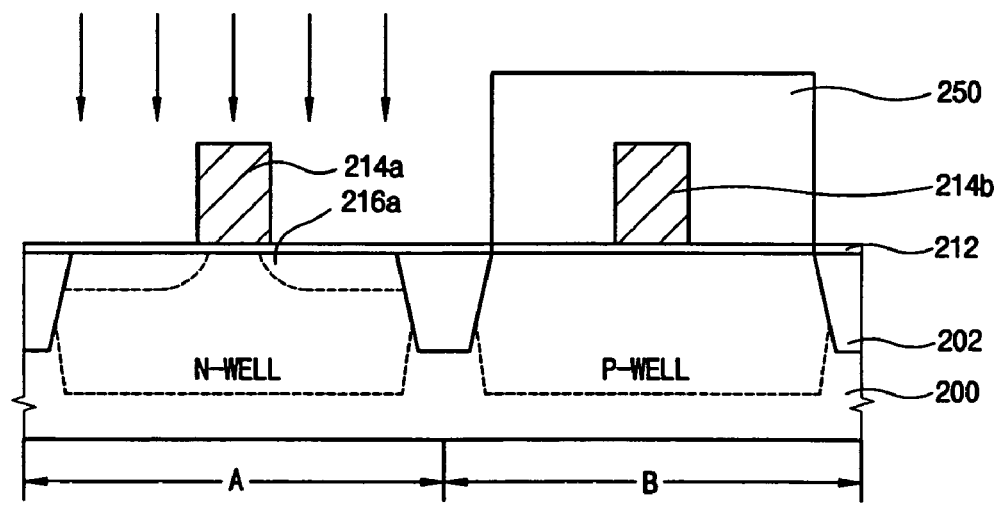

Referring to FIG. 3B, a first photoresist pattern 250 is formed on the substrate 200 to cover the second area B where the N type MOS transistor is formed. P type impurities are implanted into first portions of the substrate 200 with a relatively low concentration using the gate electrode 214a in the first area A as an ion implantation mask as indicated using arrows. Accordingly, first impurity regions 216a are formed in the first area A of the substrate 200. Examples of the P type impurities may include an element in Group III such as boron, gallium, indium, etc. The first photoresist pattern 250 is then removed from the substrate 200 by an ashing process and/or a stripping process.

Figure 3C:
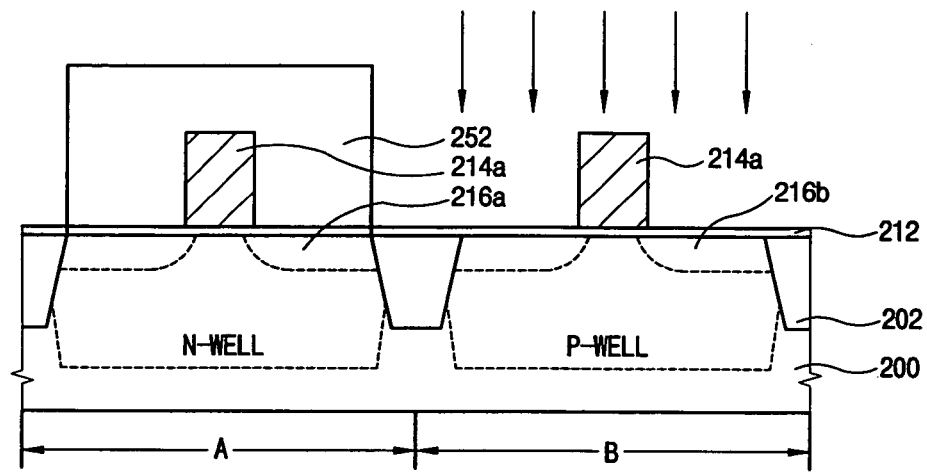

Referring to FIG. 3C, a second photoresist pattern 252 is formed on the first area A of the substrate 200 where the P type MOS transistor is formed. N type impurities having are implanted into second portions of the substrate 200 with a relatively low concentration as indicated using arrows while the gate electrode 214b in the second area B is used as an ion implantation mask. Thus, second impurity regions 216b are formed in the second area B of the substrate 200.

Figure 3D:
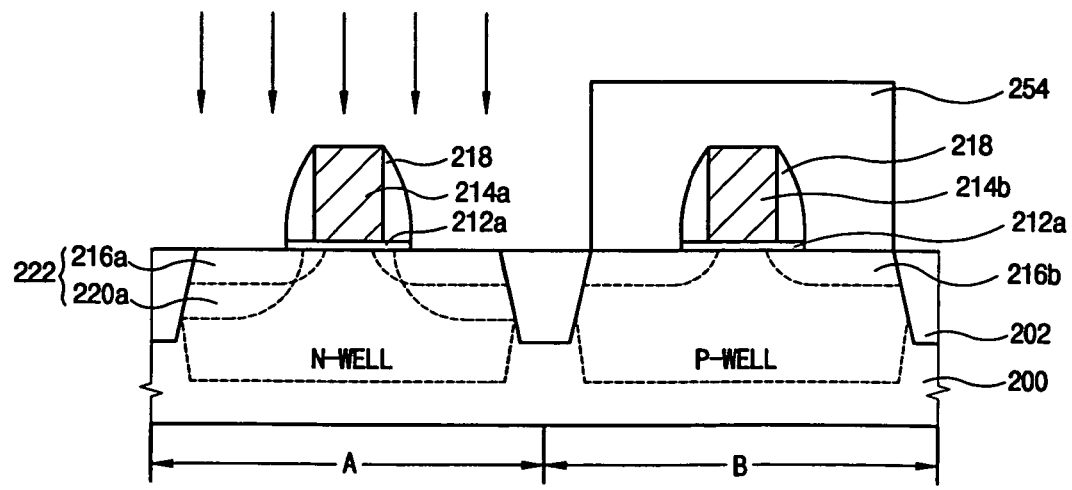

Referring to FIG. 3D, a nitride layer (not shown) having a thickness of no more than about 100 Å is formed on the first and second areas A and B of the substrate 200 to cover the gate electrodes 214a and 214b and the gate oxide layer 212. The nitride layer is etched until the gate electrodes 214a and 214b and the gate oxide layer 112 are exposed so that gate spacers 116 are formed on sidewalls of the gate electrodes 214a and 214b, respectively.

A third photoresist pattern 254 is formed in the second area B to cover the gate electrode 214b. N type impurities are implanted into the first portions of the substrate 200 with a relatively high concentration using the gate electrode 214a having the spacer 218 as an ion implantation mask as represented using arrows. Hence, third impurity regions 220a are formed in the first area A of the substrate 200. The first and third impurity regions 216a and 220a are partially overlapped with each other to form source/drain regions 222 of the P type MOS transistor having an LDD structure. Meanwhile, the gate oxide layer 212 is transformed into a gate oxide layer pattern 212a in the above-described processes, by virtue of its being etched. The third photoresist pattern 254 is then removed from the substrate 200 by an ashing process and/or a stripping process.

Figure 3E:
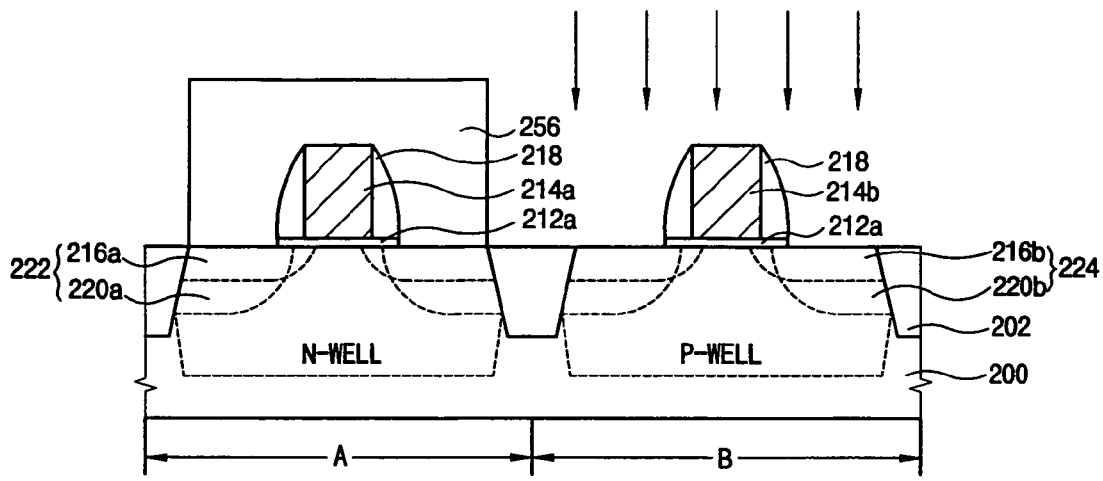

Referring to FIG. 3E, a fourth photoresist pattern 256 is formed in the first area A of the substrate 200 where the P type MOS transistor is formed. P type impurities are implanted into the second portions of the substrate 200 with a high concentration as indicated using arrows while the gate electrode 214b having the spacer 218 is used as an ion implantation mask. Thus, fourth impurity regions 220b are formed in the second area B of the substrate 200. The second and fourth impurity regions 216b and 220b are partially overlapped with each other to form source/drain regions 224 of the N type MOS transistor having an LDD structure. Here, the gate oxide layer 212 is changed into a gate oxide layer pattern 212a in the above-described processes. The fourth photoresist pattern 256 is then removed from the substrate 200 by an ashing process and/or a stripping process.

Channel regions are positioned at portions of the substrate 200 under the gate electrodes 214a and 214b between the source/drain regions 222 and 224, respectively. When voltages are applied to the gate electrodes 214a and 214b, respectively, the source/drain regions 222 and 224 are electrically connected to each other through the channel regions.

Figure 3F:
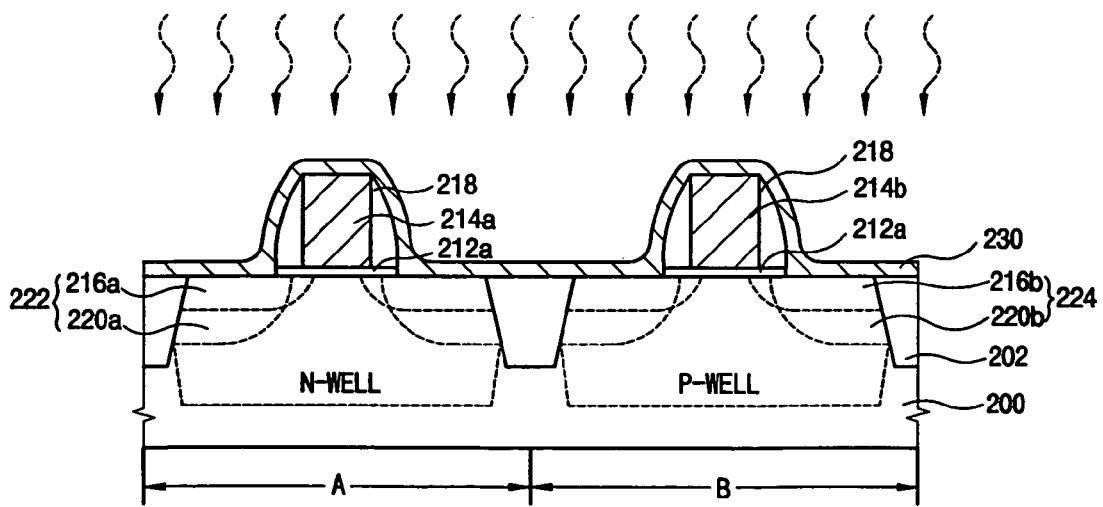

Referring to FIG. 3F, a cobalt layer 230 having a thickness of no more than about 500 Å is formed on the substrate 200 to cover the gate electrodes 214a and 214b, and the spacers 216.

Figure 3G:
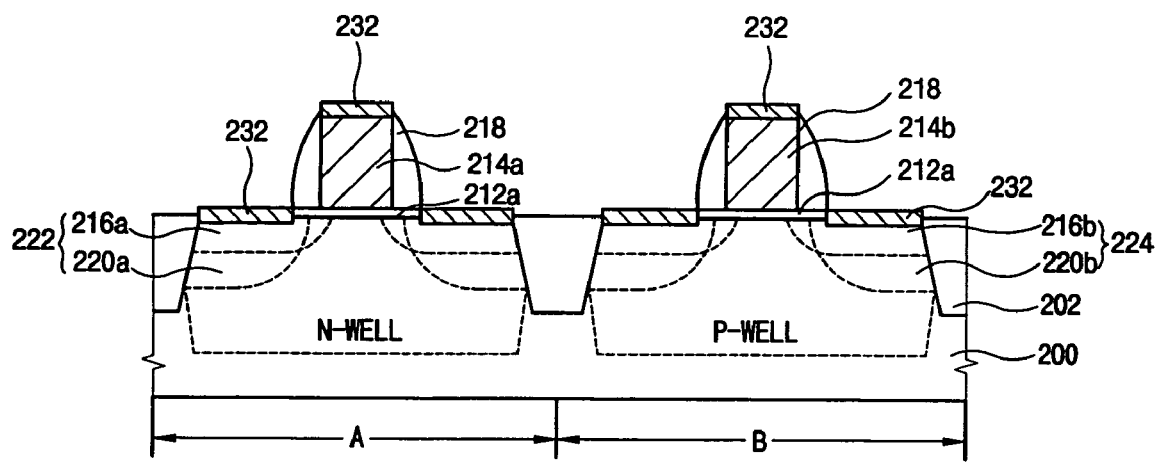

Referring to FIG. 3G, the substrate 200 is primarily thermally treated at a temperature of no more than about 550° C. to form preliminary cobalt silicide layers 232 on the gate electrodes 214a and 214b and the source/drain regions 222 and 224 of the P type MOS transistor and the N type MOS transistor, respectively. The preliminary cobalt silicide layers 232 may be formed by chemical reaction between silicon in the gate electrode 114a and the source/drain regions 124 and cobalt in the cobalt layer 126. Then, any remaining cobalt layer 230 is removed from the spacers 218 and the substrate 200 by a wet etching process.

Figure 3H:
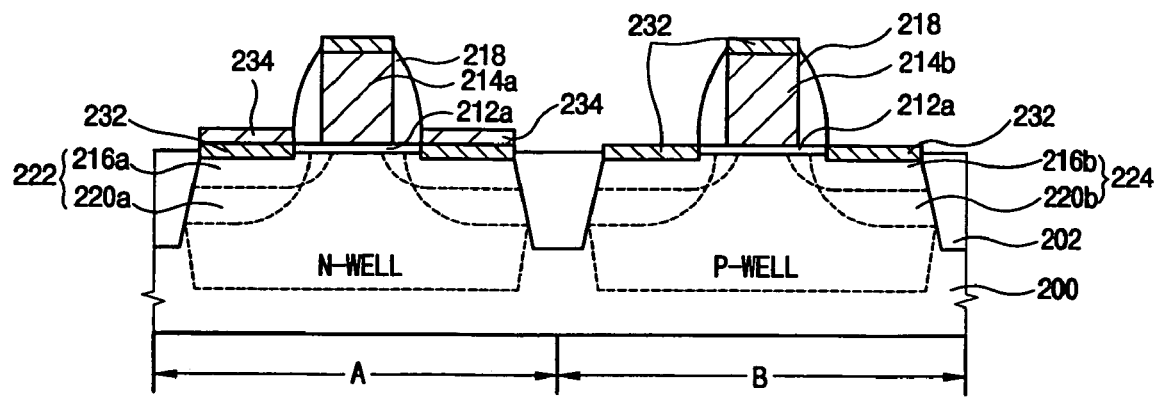

Referring to FIG. 3H, a titanium nitride layer pattern 234, serving as a capping layer, is formed on a portion of the preliminary cobalt silicide layer 232 positioned in the first area A. That is, the titanium nitride layer pattern 234 is on the source/drain regions 222 of the P type MOS transistor. The titanium nitride layer pattern 234 has a thermal expansion coefficient substantially greater than that of the preliminary cobalt silicide layer 232. Particularly, a titanium nitride layer (not shown) is formed on the preliminary cobalt silicide layer 232 and the substrate 200. A photoresist pattern (not shown) is formed on the source/drain regions 222 of the P type MOS transistor. The titanium nitride layer is partially etched using the photoresist pattern as an etching mask to thereby form the titanium nitride layer pattern 234 on the source/drain regions 222 of the P type MOS transistor.

Figure 3I:
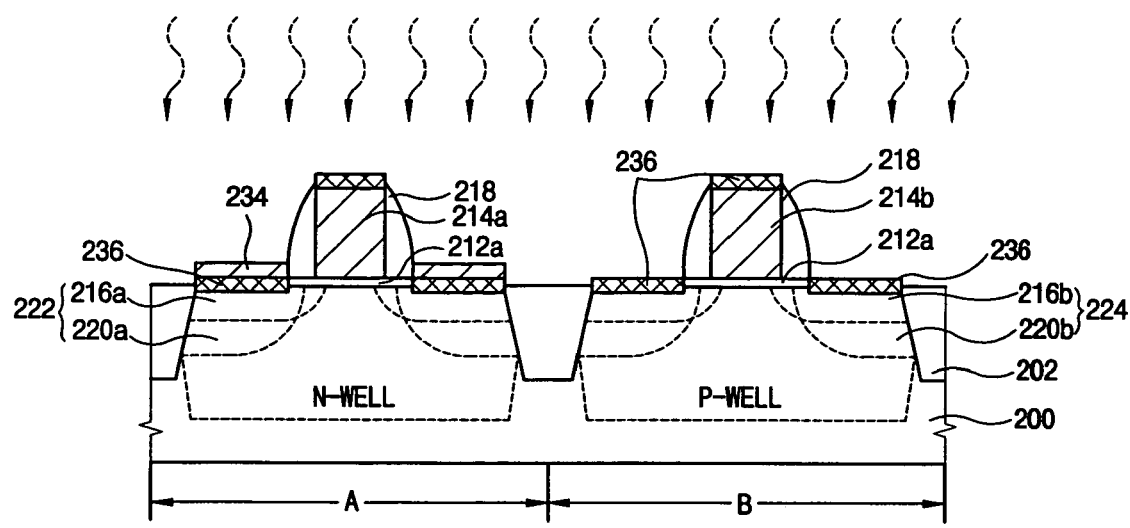

Referring to FIG. 3I, the substrate 200 including the gate electrodes 214a and 214b, the spacers 218, the preliminary cobalt layers 232 and the titanium nitride layer pattern 234 is secondarily thermally treated at a temperature of about 750° C. to about 950° C. so that the material in the preliminary cobalt silicide layer 232 is phase-changed into cobalt silicide. As a result, cobalt silicide layers 236 are formed in the first and the second areas A and B. The cobalt silicide layer 236 in the first area A has a thermal expansion coefficient substantially less than that of the titanium nitride layer pattern 234.

Figure 3J:
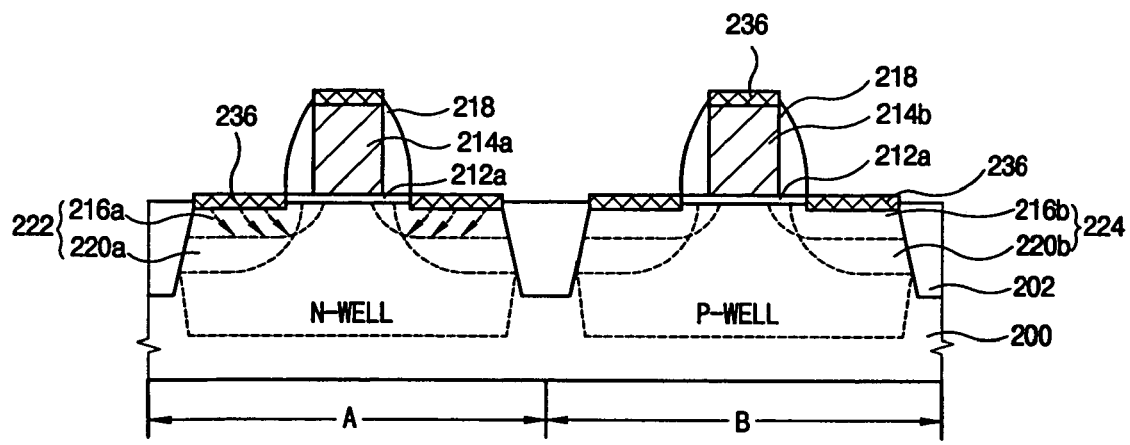

Referring to FIG. 3J, the substrate 200 including the cobalt silicide layers 236 and the titanium nitride layer pattern 234 is cooled so that a tensile stress is generated toward the source/drain regions 222 to press the source/drain regions 222. The titanium nitride layer pattern 234 is then removed. In particular, the tensile stress is generated in contracting the cobalt silicide layer 236 and the titanium nitride layer pattern 234 in the first area A after thermally expanding the cobalt silicide layer 236 and the titanium nitride layer pattern 234. The tensile stress operates to reduce intervals between atoms in the channel region of the P type MOS transistor to increase mobility of carriers in the channel region of the P type MOS transistor. That is, the tensile stress is applied to the source/drain regions 222 in the first area A to reduce the intervals between the atoms in the channel region, thereby increasing the mobility of the carriers. As a result, the P type MOS transistor of the present embodiment exhibits improved performance due to the increased mobility of the carriers.

Figure 3K:
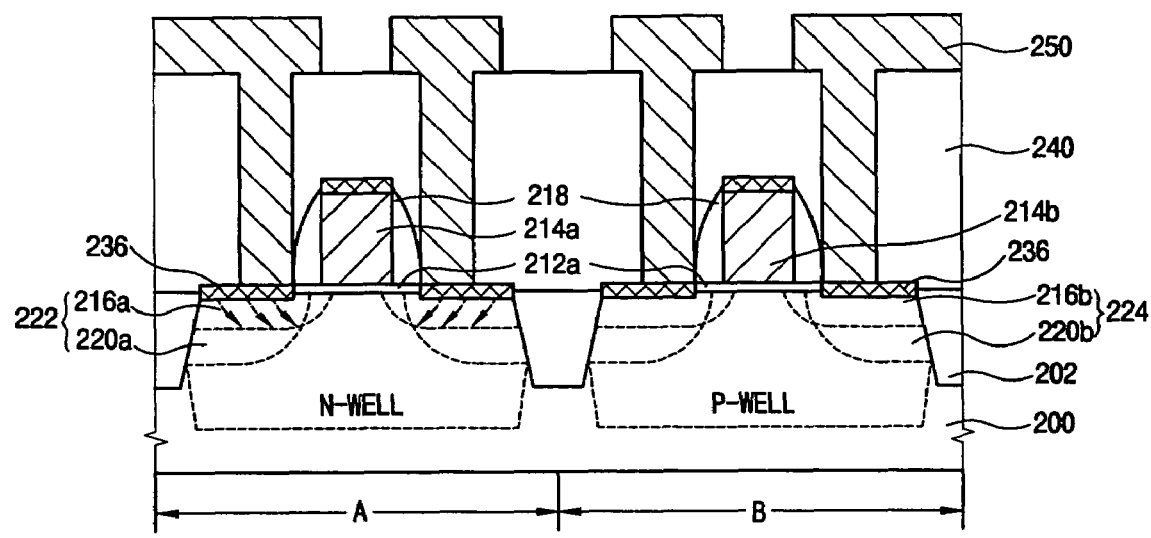

Referring to FIG. 3K, an insulating material such as borophosphorus silicate glass (BPSG) is formed on the substrate 200 to cover the gate electrodes 214a and 214b, the cobalt silicide layers 236. Thus, an insulating interlayer 240 is formed on the substrate 200 to cover the resultant structures. The insulating interlayer 240 may be re-flowed to have a planarized surface by an annealing process.

Contact holes are formed through the insulating interlayer 240 to expose the cobalt silicide layers 236 positioned on the source/drain regions 222 and 224.

Each of the contact holes is filled with a conductive material to form a contact plug 250 therein. The contact plug 250 electrically connects the MOS transistor to a bit line (not shown).

According to the present invention, a tensile stress caused by a difference of thermal expansion coefficients between a capping layer and a metal silicide layer may be applied to source/drain regions of P type MOS transistor. As a result, the mobility of carriers in the channel region of the P type MOS transistor is greatly increased. Accordingly, a CMOS transistor can be fabricated to include a P type MOS transistor having such improved characteristics.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of manufacturing a semiconductor device comprising:
   selectively forming a preliminary metal silicide layer on source/drain regions of a transistor formed on a substrate;
   forming a capping layer on the substrate having the preliminary metal silicide layer, the capping layer having a thermal expansion coefficient greater than a thermal expansion coefficient of the preliminary metal silicide layer; and
   thermally treating the substrate having the capping layer and the preliminary metal silicide layer to form a metal silicide layer and to apply a tensile stress to the source/drain regions of the transistor, the tensile stress being generated by a thermal expansion coefficient difference between the metal silicide layer and the capping layer.

2. The method of claim 1, wherein the transistor comprises a P type metal oxide semiconductor (MOS) transistor.

3. The method of claim 1, wherein forming the transistor comprises:
   providing the substrate having an isolation layer;
   forming a gate electrode on the substrate;
   implanting first impurities at a relatively low concentration into the substrate using the gate electrode as an ion implantation mask;
   forming a spacer on a sidewall of the gate electrode; and
   implanting second impurities at a relatively high concentration into the substrate using the gate electrode having the spacer as an ion implantation mask to form the source/drain regions having lightly doped drain (LDD) structures.

4. The method of claim 1, further comprising cooling the capping layer and the metal silicide layer to generate the tensile stress that reduces intervals between atoms in a channel region of the transistor to improve mobility of carriers in the channel region.

5. The method of claim 1, wherein forming the preliminary metal silicide layer comprises:
   forming a metal layer on the substrate having the transistor;
   thermally treating the metal layer at a temperature of not more than about 550° C. to form the preliminary metal silicide layer on the source/drain regions and a gate electrode of the transistor; and
   removing non-reactive portions of the metal layer.

6. The method of claim 5, wherein the metal layer comprises cobalt, the preliminary metal silicide layer comprises cobalt silicide, and the capping layer comprises titanium nitride.

7. The method of claim 1, wherein the capping layer is formed on the source/drain regions only.

8. The method of claim 1, wherein the substrate having the capping layer and the preliminary metal silicide layer is thermally treated at a temperature of about 750° C. to about 950° C.

9. A method of manufacturing a semiconductor device comprising:
   selectively forming a preliminary metal silicide layer on a substrate having a transistor having source/drain regions, wherein forming the preliminary metal silicide layer comprises:
      forming a metal layer on the substrate having the transistor;
      thermally treating the metal layer at a temperature of not more than about 550° C. to form the preliminary metal silicide layer on the source/drain regions and a gate electrode of the transistor; and
      removing non-reactive portions of the metal layer;
   forming a capping layer on the substrate having the preliminary metal silicide layer, the capping layer having a thermal expansion coefficient greater than a thermal expansion coefficient of the preliminary metal silicide layer; and
   thermally treating the substrate having the capping layer and the preliminary metal silicide layer to form a metal silicide layer and to apply a tensile stress to the source/drain regions of the transistor, the tensile stress being generated by a thermal expansion coefficient difference between the metal silicide layer and the capping layer.

10. The method of claim 9, wherein the metal layer comprises cobalt, the preliminary metal silicide layer comprises cobalt silicide, and the capping layer comprises titanium nitride.

* * * * *